(12) United States Patent
Schaeffer et al.

(10) Patent No.: US 8,252,619 B2
(45) Date of Patent: Aug. 28, 2012

(54) TREATMENT OF THIN FILM LAYERS PHOTOVOLTAIC MODULE MANUFACTURE

(75) Inventors: Cory Allen Schaeffer, Arvada, CO (US); Brian Robert Murphy, Golden, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 146 days.

(21) Appl. No.: 12/766,135

(22) Filed: Apr. 23, 2010

(65) Prior Publication Data

US 2011/0263070 A1     Oct. 27, 2011

(51) Int. Cl.
*H01L 21/00* (2006.01)

(52) U.S. Cl. ............ 438/84; 438/86; 257/E21.068

(58) Field of Classification Search .......... 438/84, 438/86, 102, 95; 118/73, 305, 313, 314, 118/315
See application file for complete search history.

(56) References Cited

U.S. PATENT DOCUMENTS

| | | | |
|---|---|---|---|
| 3,682,578 A * | 8/1972 | Lachiche | 425/86 |
| 3,880,633 A | 4/1975 | Jordan et al. | |
| 4,950,615 A | 8/1990 | Basol et al. | |
| 5,147,498 A | 9/1992 | Nashimoto | |
| 5,248,349 A | 9/1993 | Foote et al. | |
| 5,372,646 A | 12/1994 | Foote et al. | |
| 5,772,715 A | 6/1998 | McMaster et al. | |
| 5,916,375 A * | 6/1999 | Agui et al. | 136/258 |
| 6,251,701 B1 | 6/2001 | McCandless | |
| 6,423,565 B1 * | 7/2002 | Barth et al. | 438/57 |
| 6,719,848 B2 | 4/2004 | Faykosh et al. | |
| 7,301,155 B2 | 11/2007 | Tokuda et al. | |
| 7,901,975 B2 * | 3/2011 | Chen | 438/94 |
| 2002/0078890 A1 * | 6/2002 | Tsujii et al. | 118/708 |
| 2008/0149179 A1 | 6/2008 | Romeo et al. | |
| 2008/0311298 A1 | 12/2008 | Kappler | |
| 2009/0194165 A1 | 8/2009 | Murphy et al. | |
| 2009/0242029 A1 | 10/2009 | Paulson et al. | |
| 2010/0055827 A1 | 3/2010 | Barth et al. | |

FOREIGN PATENT DOCUMENTS

DE    102005062528 A1    6/2007

(Continued)

OTHER PUBLICATIONS

EP Search Report and Opinion dated Dec. 16, 2011 from corresponding Application No. EP11162987.9.

(Continued)

*Primary Examiner* — Charles Garber
*Assistant Examiner* — Reema Patel
(74) *Attorney, Agent, or Firm* — Dority & Manning, P.A.

(57) ABSTRACT

Systems and processes for treatment of a cadmium telluride thin film photovoltaic device are generally provided. The systems can include a treatment system and a conveyor system. The treatment system includes a preheating section, a treatment chamber, and an anneal oven that are integrally interconnected within the treatment system. The conveyor system is operably disposed within the treatment system and configured for transporting substrates in a serial arrangement into and through the preheat section, into and through the treatment chamber, and into and through the anneal oven at a controlled speed. The treatment chamber is configured for applying a material to a thin film on a surface of the substrate and the anneal oven is configured to heat the substrate to an annealing temperature as the substrates are continuously conveyed by the conveyor system through the treatment chamber.

14 Claims, 6 Drawing Sheets

FOREIGN PATENT DOCUMENTS

| | | |
|---|---|---|
| EP | 1160880 A2 | 12/2001 |
| EP | 2343397 A1 | 7/2011 |
| JP | 59011641 A | 1/1984 |
| JP | 2002246356 A | 8/2002 |
| WO | 2009105423 A1 | 8/2009 |

OTHER PUBLICATIONS

McCandless B. E. et al., "Recrystallization and Sulfur Diffusion in CdCl2-Treated CdTe/CdS Thin Films", Progress in Photovoltaics. Research and Applications, John Wiley and Sons, Chichester, GB, vol. 5, No. 4, pp. 249-260, Jul. 1, 1997.

Bonnet D, "Manufacturing of CSS CdTe solar cells", Thin Solid Films, Elsevier-Sequoia S.A. Lausanne, CH, vol. 361-362, No. 1, pp. 547-552, Feb. 1, 2000.

* cited by examiner

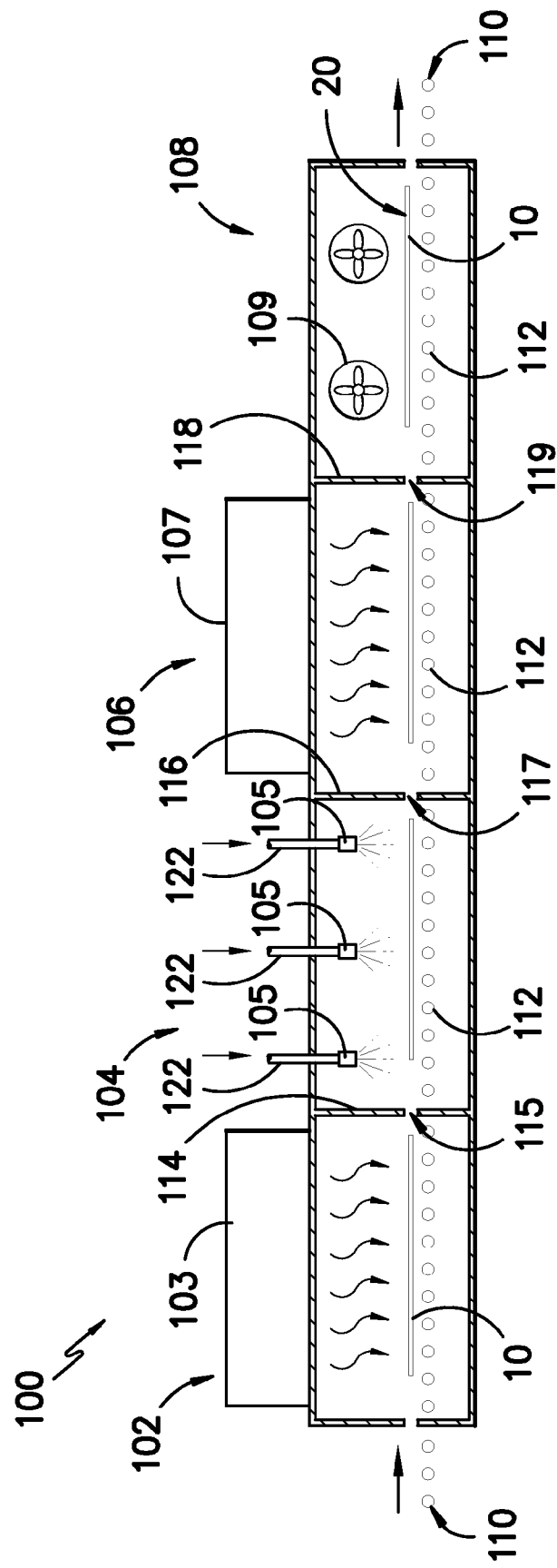
FIG. -1-

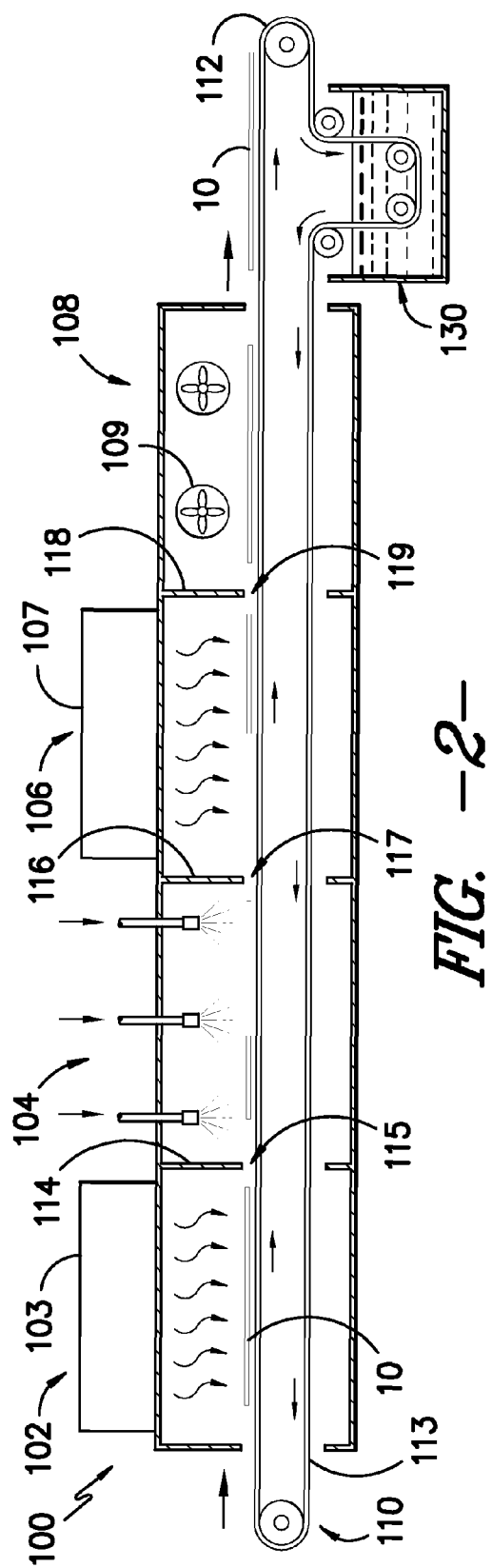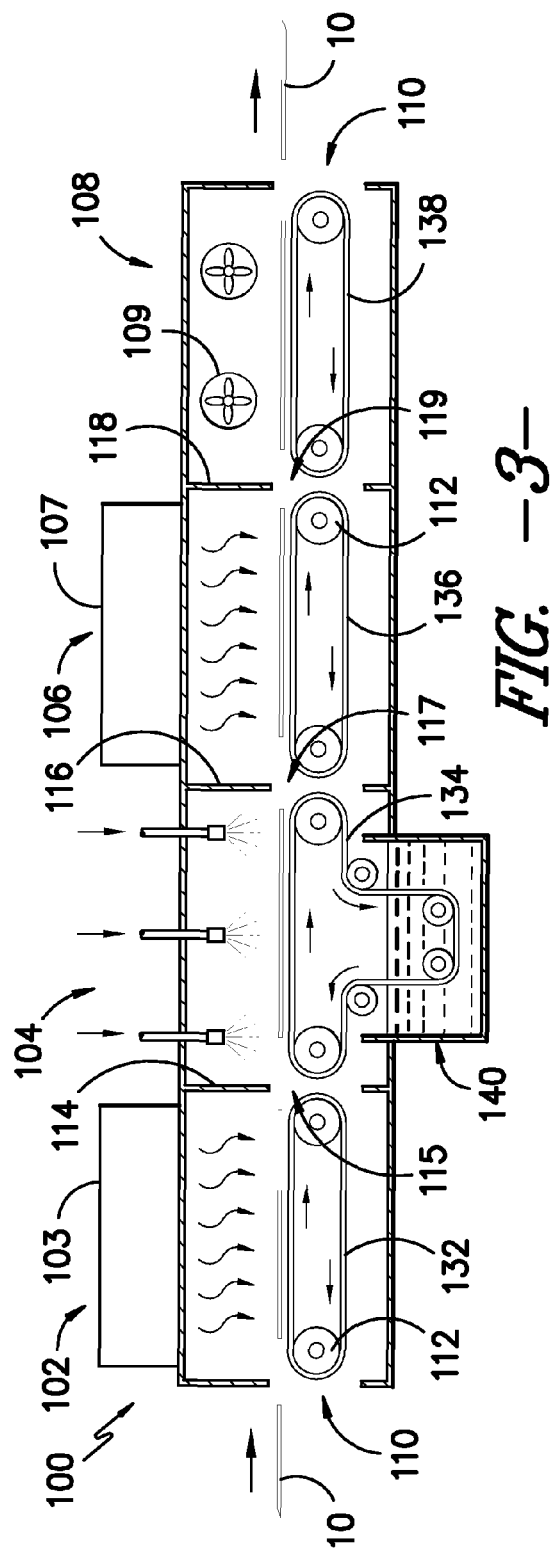

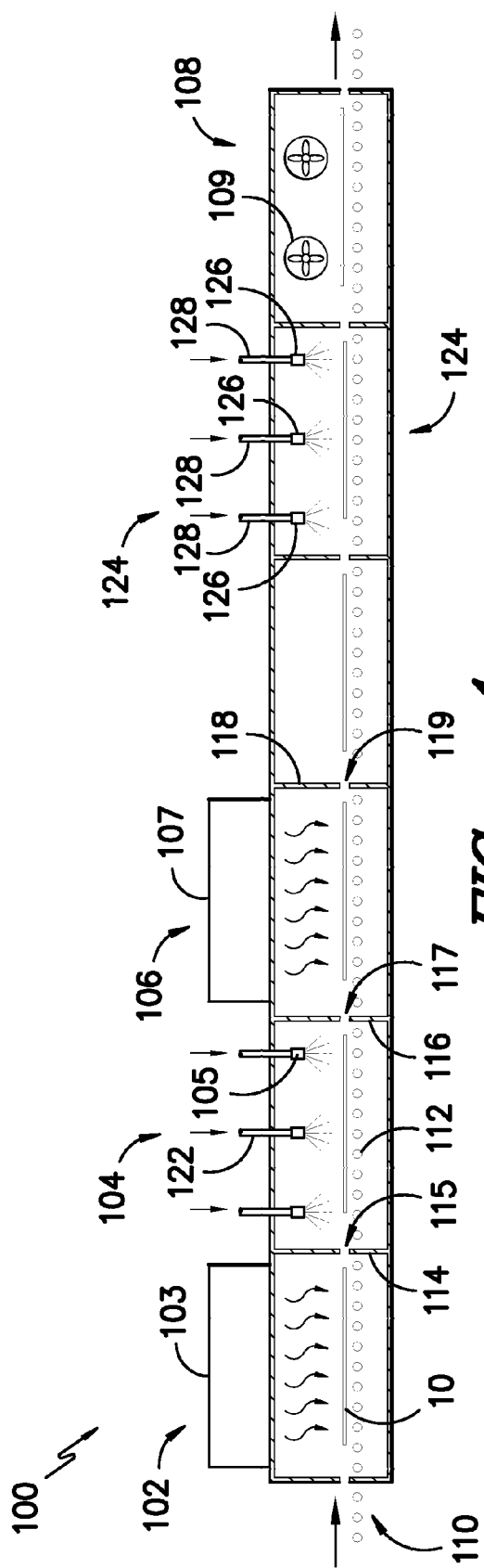
FIG. -4-
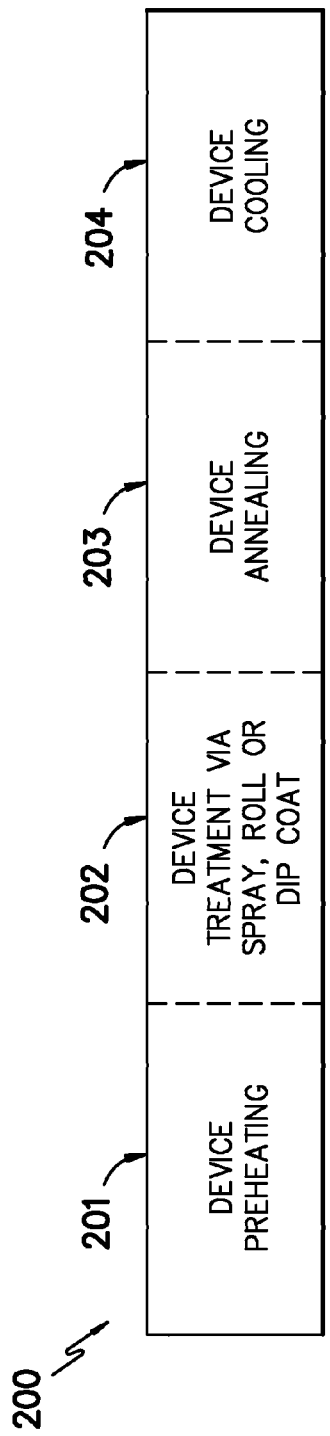
FIG. -5-

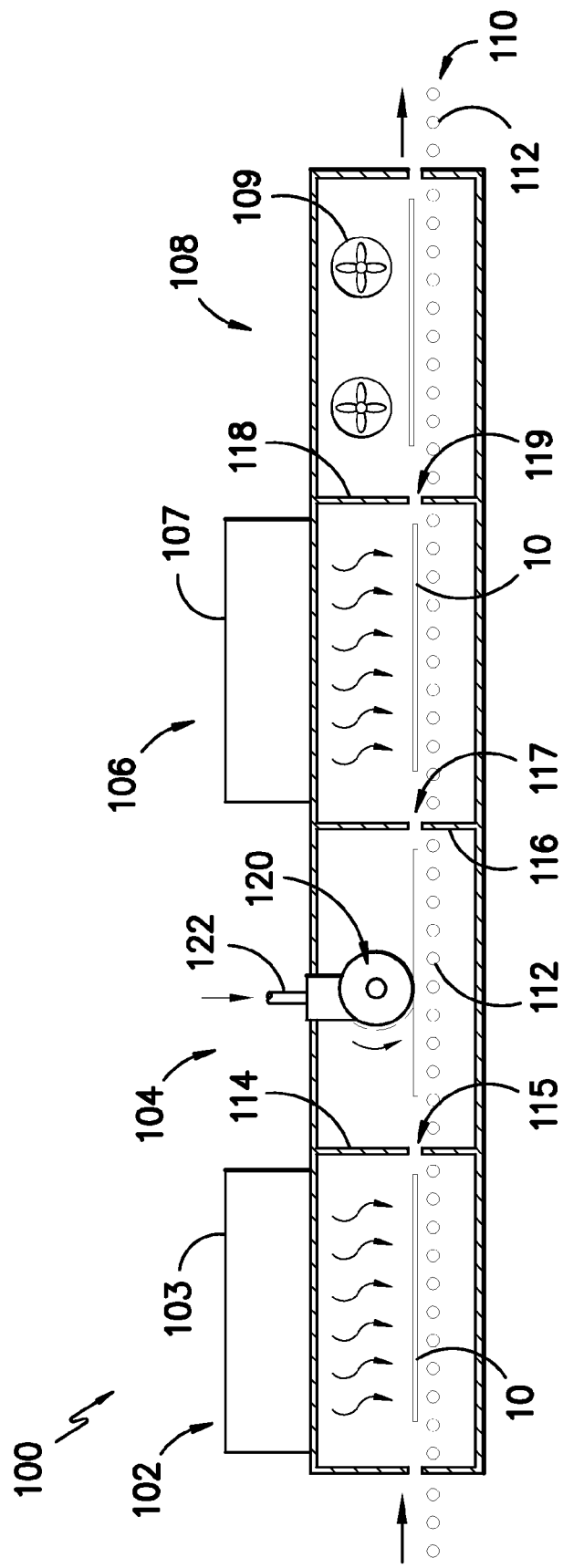
FIG. -6-

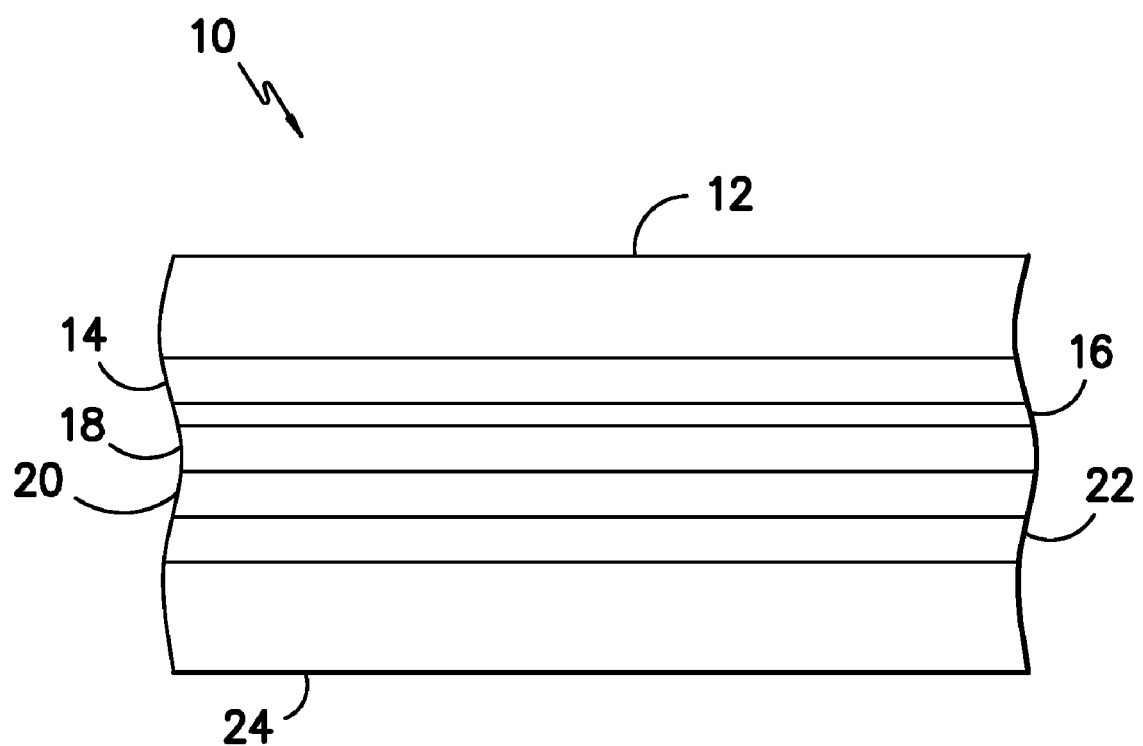
FIG. -7-

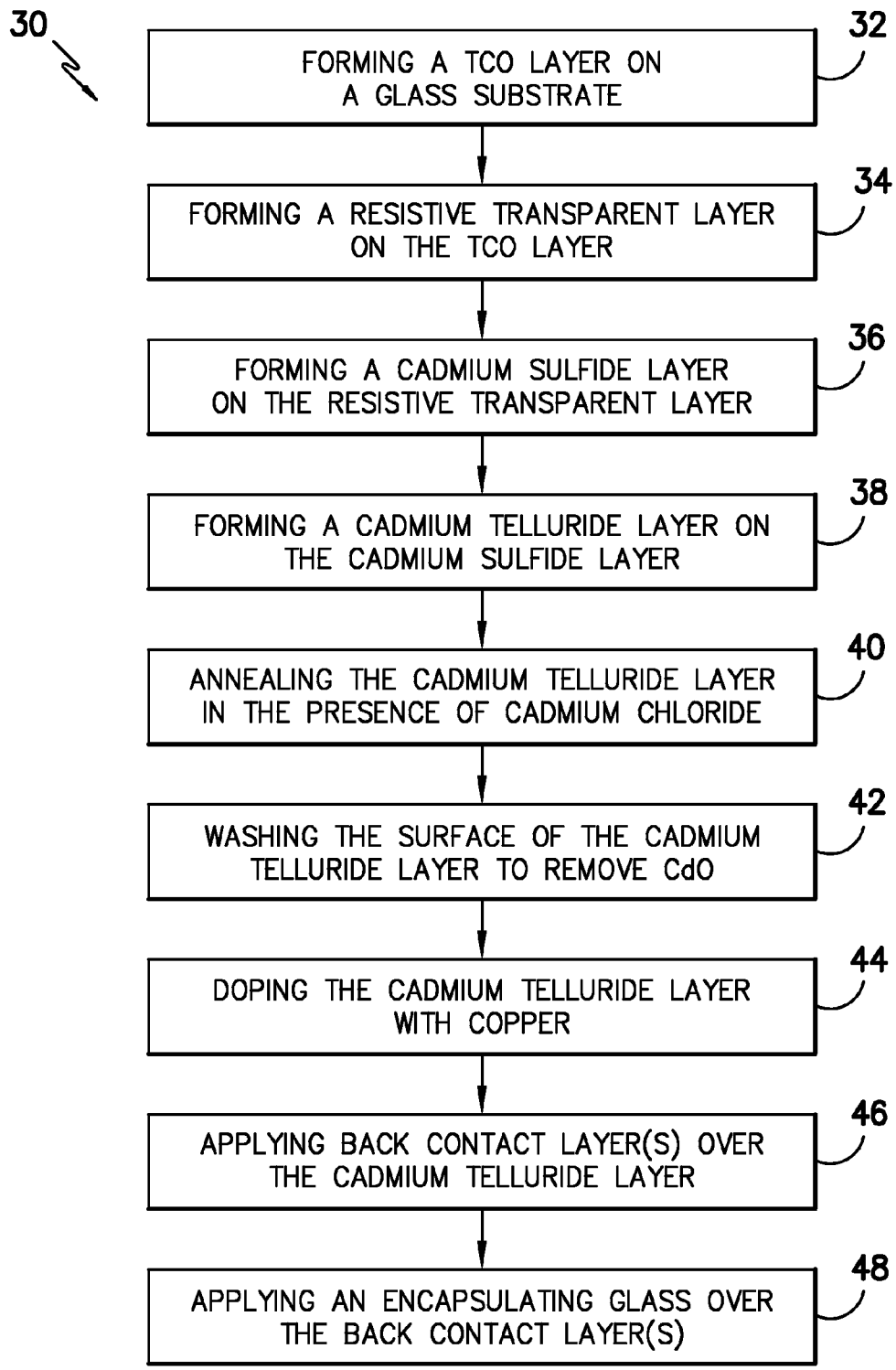
FIG. -8-

TREATMENT OF THIN FILM LAYERS PHOTOVOLTAIC MODULE MANUFACTURE

FIELD OF THE INVENTION

The subject matter disclosed herein relates generally to methods and systems for depositing back contact materials during manufacture of photovoltaic devices.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer). Free carrier pairs are created by light energy and then separated by the p-n heterojunction to produce an electrical current.

During the production of CdTe PV modules, the surface of the cadmium telluride layer can be post-treated to wash the surface, add additional dopants to the layer, or add layers onto the cadmium telluide layer. For example, the cadmium telluride layer can be washed with a cadmium chloride solution, and then annealed to introduce chloride ions into the cadmium telluride layer. Typically, this process includes washing the cadmium telluride layer with the cadmium chloride solution at room temperature (e.g., about 20° C. to about 25° C.) then transferring the CdTe PV module to an oven for annealing.

However, the CdTe PV module is exposed to the room atmosphere after application of the cadmium chloride solution while being transported to the annealing oven. This exposure can result in the introduction of additional atmospheric materials into the solution of cadmium chloride and/or on the surface of the cadmium telluride layer. These materials can lead to the introduction of impurities in the CdTe PV module. Additionally, the room atmosphere naturally varies over time, adding a variable to a large-scale manufacturing process of the CdTe PV modules. Such impurities and additional variables can lead to inconsistent CdTe PV modules from the same manufacturing line and process.

Thus, a need exists for methods and systems for reducing the introduction of impurities and additional variables into a large-scale manufacturing process of making the CdTe PV modules.

BRIEF DESCRIPTION OF THE INVENTION

Aspects and advantages of the invention will be set forth in part in the following description, or may be obvious from the description, or may be learned through practice of the invention.

Systems for treatment of a cadmium telluride thin film photovoltaic device are generally provided in one embodiment of the present invention. The systems can include a treatment system and a conveyor system. The treatment system includes a preheating section, a treatment chamber, and an anneal oven that are integrally interconnected within the treatment system. The conveyor system is operably disposed within the treatment system and configured for transporting substrates in a serial arrangement into and through the preheat section, into and through the treatment chamber, and into and through the anneal oven at a controlled speed. The treatment chamber is configured for applying a material to a thin film on a surface of the substrate and the anneal oven is configured to heat the substrate to an annealing temperature as the substrates are continuously conveyed by the conveyor system through the treatment chamber.

Processes are also generally provided for treatment of a cadmium telluride thin film photovoltaic device. The substrates can be individually introduced into a preheat chamber and heated within the preheat chamber to the deposition temperature. The substrates can then be conveyed in serial arrangement into a treatment chamber that is integrally interconnected to the preheat chamber, and treatment composition can be applied to a surface of the substrates. The substrates can be conveyed in serial arrangement into an anneal oven that is integrally interconnected to the treatment chamber, and annealed at an anneal temperature from about 250° C. to about 500° C.

Processes for forming a cadmium telluride thin film photovoltaic device are also generally provided. The process can include forming a cadmium sulfide layer on a substrate and forming a cadmium telluride layer on the cadmium sulfide layer. Thereafter, the substrates can be treated according to the systems and processes described briefly above.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which:

FIG. 1 shows a general schematic of a cross-sectional view of an exemplary treatment system for treating a surface of a substrate according to an embodiment of the present invention;

FIG. 2 shows a general schematic of a cross-sectional view of another exemplary treatment system for treating a surface of a substrate including a dip tank for washing a conveyor belt according to an embodiment of the present invention;

FIG. 3 shows a general schematic of a cross-sectional view of another exemplary treatment system for treating a surface of a substrate including a dip tank for washing a conveyor belt according to an embodiment of the present invention;

FIG. 4 shows a general schematic of a cross-sectional view of yet another exemplary treatment system for treating a surface of a substrate according to an embodiment of the present invention;

FIG. 5 shows an exemplary diagram of a process of using the treatment systems of any of FIG. 1-4 or 6;

FIG. 6 shows a general schematic of a cross-sectional view of yet another exemplary treatment system for treating a surface of a substrate according to an embodiment of the present invention;

FIG. 7 shows a general schematic of a cross-sectional view of an exemplary cadmium telluride thin film photovoltaic device according to one embodiment of the present invention; and, FIG. 8 shows a flow diagram of an exemplary method of manufacturing a photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, methods and systems are presently disclosed for increasing the efficiency and/or consistency of in-line manufacturing of cadmium telluride thin film photovoltaic devices. In one particular embodiment, methods and systems for post-treating the cadmium telluride layer formed on the substrate are generally disclosed.

FIG. 1 shows an exemplary treatment system 100 according to one embodiment of the present invention. The treatment system 100 includes a preheat section 102, a treatment chamber 104, an anneal oven 106, and an optional cooling chamber 108.

Each of the preheat section 102, the treatment chamber 104, the anneal oven 106, and the optional cooling chamber 108 are integrally interconnected together such that devices 10 passing through the treatment system 100 are substantially protected from the outside environment. In other words, the component sections of the treatment system 100 are directly integrated together such that a device 10 exiting one component section immediately enters the adjacent section. For example, FIG. 5 shows an exemplary diagram of a method 200 that can be performed by the treatment system 100. The device can be preheated at 201, and then transferred directly to be treated (e.g., spray, roll, or dip coat) at 202. Then, the device 10 can be annealed at the anneal temperature at 203, and then cooled at 204. The method 200 is shown having interconnected steps to represent that the devices are transferred from one step to the next step directly, without exposure to the room atmosphere. Of course, other intermediary steps may be included within the method 200, as long as the steps are also interconnected to the other steps of the method 200.

Internal wall 114 is shown separating the preheat section 102 from the treatment chamber 104. The devices 10 can pass from the preheat section 102 into the treatment chamber 104 through slit 115 defined in the wall 114. The slit 115 is sized and shaped to allow the devices 10 to pass therethrough, while effectively separating the preheat section 102 and the treatment chamber 104. For example, the slit 115 can define a height that is from about 105% to about 250% of the thickness of the devices 10, such as from about 125% to about 200% of the thickness of the devices. The slit 115 can be defined across the entire length of the wall 115, or may be sized according to the width of the devices 10. In particular embodiments, the slit 115 may have a length that is from about 101% to about 150% of the width of the devices 10.

The treatment chamber 104 is separated from the anneal oven 106 by an internal wall 116 defining a slit 117. Likewise, the anneal oven 106 is separated from the optional cooling chamber 108 by an internal wall 118 defining a slit 119. Both internal walls 116 and 118 are similar to the internal wall 114 separating the preheat section 102 from the treatment chamber 104.

The preheat section 102 is configured to preheat the devices 10 to a treatment temperature prior to entering the treatment chamber 104. A heat source 103 is connected to the preheat section 102 to control the temperature of the substrate. For example, the preheat section 103 can raise the temperature of the device 10 from room temperature (e.g., from about 20° C. to about 25° C.) to the desired treatment temperature upon entering the preheating section. The treatment temperature may be varied as desired according to the particular treatment being subsequently carried out in the treatment chamber 104. In one embodiment, the preheat section 102 can be constructed from a series of ovens sequentially aligned and interconnected.

Since the preheat section 102 and the treatment chamber 104 are integrally interconnected within the treatment system 100, the preheated device 10 passing from the preheat section 102 to the treatment chamber 104 will remain substantially at the treatment temperature without any opportunity to significantly cool before treatment. Thus, the preheat section 102 can be configured to heat the device 102 to the desired treatment temperature, and does not require calculating heat loss prior to treatment and heating to a temperature higher than desired to account for any heat loss. As such, the preheat section 102 integrally interconnected to the treatment chamber 104 can allow for more precise temperature control and reduced energy consumption by the heat source 103.

The treatment chamber 104 can apply a post-deposition treatment to a thin film layer on the device 10. The treatment chamber 104 shown in the exemplary treatment system 100 of FIG. 1 shows spray nozzles 105 for spraying a treatment composition onto the device 10 (e.g., onto the cadmium telluride layer 20 of the device 10). In other embodiments, the treatment chamber 104 can include other applicators. For example, FIG. 6 shows an applicator roll 120 for applying a treatment composition onto the device 10.

The treatment composition, in one particular embodiment, is a liquid substance. When in liquid form, the treatment composition can be continuously supplied from a source tank (not shown) to the applicator(s) (e.g., the spray nozzles 105 shown in FIG. 1, the applicator roll 120 shown in FIG. 6, etc.) within the treatment chamber 104 via feed line 122. The treatment composition can, in certain embodiments, be heated to the treatment temperature prior to application. Any excess treatment composition (e.g., runoff from the device 10) can be collected from the treatment chamber 104 and removed from the treatment chamber 104. In one embodiment, the excess treatment composition can be recycled.

The devices 10 can pass from the treatment chamber 104 to the anneal oven 106 for subsequent heat treatment of the device 10. In particular, the treatment anneal oven 106 can heat the device 10 to an anneal temperature sufficient to anneal the desired layers on the device 10 (e.g., the cadmium telluride layer 20, etc.). The anneal temperature can vary from material to material, but is generally above the re-crystallization temperature of the material. The devices 10 can be contained within the anneal oven for a time sufficient to raise the substrate temperature to the anneal temperature and sustain that temperature for a desired time prior to cooling. In one embodiment, the anneal oven 106 can be constructed from a series of ovens sequentially aligned and interconnected.

The treatment system 100 can also include the optional cooling chamber 108 downstream of the anneal oven 106. FIG. 1 shows the cooling chamber 108 including fans 109 for circulating cool air onto the devices 10 after annealing. However, other cooling elements can also be used in the cooling chamber 108 to cool the devices 10 after annealing. In one embodiment, the cooling chamber 108 is configured to reduce the temperature of the device 10 from the anneal temperature to room temperature (e.g., from about 20° C. to about 25° C.). The cooling chamber is also integrally interconnected to the other components of the treatment system 100 in order to prevent any impurity or other room atmosphere variables from being introduced onto the surface, especially while the device is still heated to a temperature around the anneal temperature.

In one particular embodiment, the treatment system 100 can be used to treat the cadmium telluride layer 20 on the device 10. For example, the treatment system 100 can be used to treat the cadmium telluride layer 20 with cadmium chloride ($CdCl_2$) Annealing the cadmium telluride layer 20 can be carried out in the presence of cadmium chloride in order to dope the cadmium telluride layer 20 with chloride ions.

Using the treatment system 100, the cadmium telluride layer 20 can be washed with an aqueous solution containing cadmium chloride (e.g., sprayed through the spray nozzles 105 shown in FIG. 1, applied via the applicator roll 120 shown in FIG. 6, etc.) and then annealed at the elevated temperature. The device 10 can be preheated in the preheat section 102 to a treatment temperature from about 40° C. to about 150° C. prior to the application of cadmium chloride to the cadmium telluride layer 20, such as from about 50° C. to about 125° C. Then, following the application of the cadmium chloride in the treatment chamber 104, the device 10 can be annealed at an anneal temperature that is greater than about 200° C., such as from about 300° C. to about 500° C. In particular embodiments, the anneal temperature can be from about 400° C. to about 450° C. to anneal the cadmium telluride layer 20 after the application of cadmium chloride.

The cadmium telluride layer 20 can be annealed at the anneal temperatures for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing. The anneal oven 106 can be sized to control the anneal time within the anneal oven 106 at the rate of travel of the devices 10 through the anneal oven 106.

FIG. 4 shows another embodiment of the treatment system 100 including a wash chamber 124 including spray nozzles 126 configured to wash the surface of the device 10 to remove any cadmium oxide formed after annealing the cadmium telluride layer 20 in the presence of cadmium chloride in the anneal oven 106. The wash composition can be a liquid supplied via feed lines 128 from a supply tank (not shown). The wash chamber 124 is also integrally interconnected to the other components of the treatment system 100 in order to prevent any impurity or other room atmosphere variables from being introduced onto the surface, especially while the device is still heated to a temperature around the anneal temperature. The wash chamber 124 can also help cool the device 10 from the anneal temperature.

In one particular embodiment, the wash chamber 124 can be configured to leave a Te-rich surface on the cadmium telluride layer 20 by removing any cadmium oxide formed on the surface of the device 10. For instance, the surface can be washed with a suitable solvent (e.g., ethylenediamine also known as 1,2 diaminoethane or "DAE") to remove any cadmium oxide from the surface.

The treatment system 100 can also be used to add copper to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 through the use of the treatment chamber 100. For example, copper can be sprayed or washed on the surface of the cadmium telluride layer 20 in a solution with a suitable solvent (e.g., methanol, water, acetate, or the like, or combinations thereof) using the treatment chamber 102 followed by annealing in the anneal oven 106. In particular embodiments, the copper may be supplied in the solution in the form of copper chloride. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

Of course, other treatment compositions can be applied using the treatment system 100 as desired in the manufacture of the devices 10.

A conveyor system 110 that includes conveyor rolls 112 for transporting a plurality of devices 10 in a serial arrangement through the preheat section 102, into and through the treatment chamber 104, and into and through the anneal oven 106 at a controlled speed. The conveyor system 110 can also transport the devices 10 into and through the cooling chamber 108, when present. The conveyor system 110 may be a beltless system that relies on the rolls 112 to transport the devices 10 through the treatment system 100. Alternatively, the conveyor system 110 can also include a conveyor belt (not show in FIG. 1, 4 or 6) about the conveyor rolls 112 to transport the devices 10 through the treatment system 100.

The conveyor system 110 can, in one particular embodiment, move the devices 10 through the treatment system 100 at a substantially constant linear rate. This substantially constant linear rate through the treatment system 100 can ensure that the entire surface area of the devices 10 are treated substantially uniformly. Thus, the devices 10 formed can have substantially uniform properties throughout the surface area of the device 10 itself and from device to device in the manufacturing process.

The conveyor system 110 may include a conveyor belt or a series of conveyor belts. For example, FIG. 2 shows a conveyor belt 113 traversing the entire treatment system 100 to transport the devices 10 through the preheat section 102, the treatment chamber 104, the anneal oven 106, and the optional cooling chamber 108. A dip tank 130 is positioned such that the conveyor belt 113 can be washed after running through the treatment system 100 to clean the conveyor belt 113 from any material build-up that may have accumulated on the conveyor belt 113.

FIG. 3 shows an alternative embodiment utilizing a series of conveyor belts. As shown, each component of the treatment system 100 has a conveyor belt. For example, the preheat section 102 has a conveyor belt 132 configured to transport the devices through the preheat section 102. The treatment chamber 104 has a conveyor belt 134 configured to transport the devices through the treatment chamber 104. The anneal oven 106 has a conveyor belt 136 configured to transport the devices through the anneal oven 106. The cooling chamber 108 has a conveyor belt 138 configured to transport the devices through the cooling chamber 108. The conveyor belt 134 in the treatment chamber 104 runs through a dip tank 140 to clean the conveyor belt 134 from any excess treatment composition. In one embodiment, each of the conveyor belts 132, 134, 136, and 138 (when present) can move at substantially identical rates. Thus, the devices 10 can traverse the treatment system 100 in a substantially constant linear rate. In another embodiment, the conveyor belts 132, 134, 136, and 138 (when present) can move at different rates to allow for more time in one particular component of the treatment system 100.

The cleaning composition in the dip tank 130 shown in FIG. 2 and the dip tank 140 shown in FIG. 3 can be any suitable cleaning composition. For example, the cleaning composition can include a solvent or solvent mixture, including but not limited to, water, acetone, benzene, alcohol (methanol, ethanol, propanol, iso-propanol, butanol, etc.), dimethyl sulfoxide, ammonia, bleach, etc., and mixtures thereof. The cleaning composition can also include cleaning additives to the solvent or solvent mixture.

As stated, the presently disclosed methods and systems are particularly suitable for increasing the efficiency and/or consistency of in-line manufacturing of cadmium telluride thin film photovoltaic devices, such as in the cadmium telluride thin film photovoltaic device disclosed in U.S. Publication No. 2009/0194165 of Murphy, et al. titled "Ultra-high Current Density Cadmium Telluride Photovoltaic Modules." In particular, the methods can be useful during processing after deposition of the cadmium telluride thin film layer of the photovoltaic device, especially during the mass production of such devices.

FIG. 7 represents an exemplary cadmium telluride thin film photovoltaic device 10. The exemplary device 10 of FIG. 7 includes a top sheet of glass 12 employed as the substrate. In this embodiment, the glass 12 can be referred to as a "superstrate," as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

A transparent conductive oxide (TCO) layer 14 is shown on the glass 12 of the exemplary device 10 of FIG. 7. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering (e.g., DC sputtering or RF sputtering) on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.35 μm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering (e.g., DC sputtering or RF sputtering) on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

A cadmium sulfide layer 18 is shown on resistive transparent buffer layer 16 of the exemplary device 10 of FIG. 7. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., direct current (DC) sputtering or radio frequency (RF) sputtering) on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 μm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 μm reduces any adsorption of radiation energy by the cadmium sulfide layer 18, effectively increasing the amount of radiation energy reaching the underlying cadmium telluride layer 22.

A cadmium telluride layer 20 is shown on the cadmium sulfide layer 18 in the exemplary cadmium telluride thin film photovoltaic device 10 of FIG. 7. The cadmium telluride layer 20 is a p-type layer that generally includes cadmium telluride (CdS) but may also include other materials. As the p-type layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create electron-hole pairs upon absorption of the radiation energy. Holes may travel from the p-type side (i.e., the cadmium telluride layer 20) across the junction to the n-type side (i.e., the cadmium sulfide layer 18) and, conversely, electrons may pass from the n-type side to the p-type side. Thus, the p-n junction formed between the cadmium sulfide layer 18 and the cadmium telluride layer 20 forms a diode-like material that allows conventional current to flow in only one direction to create a charge imbalance across the boundary. This charge imbalance leads to the creation of an electric field spanning the p-n junction and separating the freed electrons and holes.

The cadmium telluride layer 20 can be formed by any known process, such as chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 μm and about 10 μm, such as from about 1 μm and about 5 μm. In one particular embodiment, the cadmium telluride layer 20 can have a thickness between about 2 μm and about 4 μm, such as about 3 μm.

A series of post-forming treatments can be applied to the exposed surface of the cadmium telluride layer 20 utilizing the treatment system 100 discussed above.

Additionally, back contact layer(s) 22 can be applied to the cadmium telluride layer 20 using the treatment system 100 or another system. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 μm to about 10 μm in thickness, for example from about 1 μm to about 5 μm. A metal layer of the back contact, if used for or as part of the back contact layer 22, can be from about 0.1 μm to about 1 μm in thickness.

The encapsulating glass 24 is also shown in the exemplary cadmium telluride thin film photovoltaic device 10 of FIG. 7.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

FIG. 8 shows a flow diagram of an exemplary method 30 of manufacturing a photovoltaic device according to one embodiment of the present invention. According to the exemplary method 30, a TCO layer is formed on a glass substrate at 32. At 34, a resistive transparent buffer layer is formed on the TCO layer. A cadmium sulfide layer is formed on the resistive transparent layer at 36, and a cadmium telluride layer is formed on the cadmium sulfide layer at 38. The cadmium telluride layer can be annealed in the presence of cadmium chloride at 40, and washed to remove any CdO formed on the surface at 42. The cadmium telluride layer can be doped with copper at 44. At 46, back contact layer(s) can be applied over the cadmium telluride layer, and an encapsulating glass can be applied over the back contact layer at 48.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A process for treatment of a cadmium telluride thin film photovoltaic device, the process comprising:
   introducing substrates individually into a preheat chamber;
   heating the substrates within the preheat chamber to a treatment temperature;
   conveying the substrates in serial arrangement into a treatment chamber that is integrally interconnected to the preheat chamber;
   applying a liquid treatment composition to a surface of the substrates;
   conveying the substrates in serial arrangement into an anneal oven that is integrally interconnected to the treatment chamber; and,
   annealing the substrates at an anneal temperature from about 250° C. to about 500° C. such that a thin film on the substrates is doped with material from the liquid treatment composition.

2. The process as in claim 1, wherein the liquid treatment composition comprises copper.

3. The process as in claim 1, wherein the liquid treatment composition comprises cadmium chloride.

4. The process as in claim 1, further comprising:
   conveying the substrates in serial arrangement into a cooling chamber; and,
   cooling the substrates to room temperature.

5. The process as in claim 1, wherein the substrates convey through the treatment chamber at a substantially constant linear rate.

6. The process as in claim 1, wherein the liquid treatment composition is sprayed onto the surface of the substrate.

7. The process as in claim 1, wherein the liquid treatment composition is applied using an applicator roll configured to apply a liquid to the surface of the substrates.

8. The process as in claim 1, wherein the substrates are conveyed via a conveyor system that comprises a single conveyor belt that traverses through the treatment chamber.

9. The process as in claim 8, further comprising:
   cleaning the conveyor belt with a cleaning system.

10. The process as in claim 9, wherein the cleaning system comprises a cleaning tank positioned such that the single conveyor belt passes through the cleaning tank on a return path.

11. The process as in claim 1, wherein the treatment chamber is defined within an individual module, and wherein the substrates are conveyed through the treatment chamber via an independent conveyor that comprises a conveyor belt and a cleaning system configured to clean the conveyor belt.

12. The process as in claim 1, wherein the substrates are conveyed through the treatment chamber.

13. A process for forming a cadmium telluride thin film photovoltaic device, the process comprising:
   forming cadmium sulfide layers on a plurality of substrates;
   forming cadmium telluride layers on the cadmium sulfide layers;
   thereafter, introducing the substrates individually into a preheat chamber;
   heating the substrates within the preheat chamber to a treatment temperature;
   conveying the substrates in serial arrangement into a treatment chamber that is integrally interconnected to the preheat chamber;
   spraying a liquid treatment composition onto a surface of the substrates, wherein the liquid treatment composition comprises cadmium chloride;
   conveying the substrates in serial arrangement into an anneal oven that is integrally interconnected to the treatment chamber; and,
   annealing the substrates at an anneal temperature from about 250° C. to about 500° C. such that a thin film on the substrates is doped with chlorine ions from the liquid treatment composition.

14. The process as in claim 13, wherein the substrates are conveyed through the treatment chamber.

* * * * *